(12) United States Patent  
Gawve

(10) Patent No.: US 6,668,910 B2  
(45) Date of Patent: Dec. 30, 2003

(54) HEAT SINK WITH MULTIPLE SURFACE ENHANCEMENTS

(75) Inventor: Warren Lee Gawve, Lockport, NY (US)

(73) Assignee: Delphi Technologies, Inc., Troy, MI (US)

(*) Notice: Subject to any disclaimer, the term of this patent is extended or adjusted under 35 U.S.C. 154(b) by 10 days.

(21) Appl. No.: 10/119,911

(22) Filed: Apr. 9, 2002

(65) Prior Publication Data

US 2003/0188849 A1 Oct. 9, 2003

(51) Int. Cl.$^7$ ............... F28F 7/00; F24H 3/02; H05K 7/20; H01L 23/34
(52) U.S. Cl. ............... 165/80.3; 165/185; 165/121; 361/697; 361/703; 257/722
(58) Field of Search ............... 165/80.3, 185, 165/121, 122; 361/697, 703, 704; 257/707, 722; 174/16.3

(56) References Cited

U.S. PATENT DOCUMENTS

| | | | | |
|---|---|---|---|---|
| 4,270,604 A | | 6/1981 | Nakamura | 165/185 |
| 4,733,293 A | | 3/1988 | Gabuzda | 357/81 |
| 4,768,581 A | * | 9/1988 | Gotwald et al. | 165/80.3 |
| 4,807,441 A | | 2/1989 | Agee et al. | 62/3 |
| 4,884,631 A | | 12/1989 | Rippel | 165/185 |
| 5,132,780 A | | 7/1992 | Higgins, III | 357/81 |
| 5,195,576 A | | 3/1993 | Hatada et al. | 165/80.3 |
| 5,205,353 A | | 4/1993 | Willemsen et al. | 165/170 |
| 5,309,983 A | | 5/1994 | Bailey | 165/80.3 |
| 5,358,032 A | * | 10/1994 | Arai et al. | 165/80.3 |
| 5,494,098 A | | 2/1996 | Morosas | 165/121 |
| 5,603,376 A | | 2/1997 | Hendrix | 165/104.34 |
| 5,613,552 A | * | 3/1997 | Osakabe et al. | 165/104.21 |
| 5,706,160 A | | 1/1998 | Latuszkin et al. | 361/119 |
| 5,709,263 A | * | 1/1998 | Mira | 165/80.3 |
| 5,896,917 A | | 4/1999 | Lemont et al. | 165/80.3 |
| 5,959,837 A | | 9/1999 | Yu | 361/697 |
| 5,983,997 A | | 11/1999 | Hou | 165/144 |
| 6,018,459 A | * | 1/2000 | Carlson et al. | 361/704 |
| 6,176,299 B1 | | 1/2001 | Hanzlik et al. | 165/80.3 |
| 6,181,556 B1 | | 1/2001 | Allman | 361/690 |
| 6,199,624 B1 | | 3/2001 | Wotring | 165/80.3 |
| 6,269,002 B1 | * | 7/2001 | Azar | 361/703 |
| 6,269,863 B1 | * | 8/2001 | Wyler | 165/80.3 |

* cited by examiner

Primary Examiner—Henry Bennett  
Assistant Examiner—Tho Duong  
(74) Attorney, Agent, or Firm—Patrick M. Griffin

(57) ABSTRACT

A heat sink for cooling electrical or electronic devices comprises a base plate having a top surface and a bottom surface for attaching to the electronic device. At least two vertical plates are affixed to and extend substantially perpendicularly from the top surface in a spaced apart manner and are parallel one to the other. A secondary fin is affixed to and extends between an upper portion of the vertical plates. The secondary fin has a top convoluted edge and a bottom convoluted edge and is oriented such that the bottom convoluted edge faces the top surface of the base plate. The secondary fin includes a plurality of individual fins formed in a convoluted accordion-like manner. The plurality of individual fins define a plurality of secondary fin passageways between adjacent ones of the individual fins wherein each secondary fin passageway extends from the top convoluted edge to the bottom convoluted edge.

16 Claims, 3 Drawing Sheets

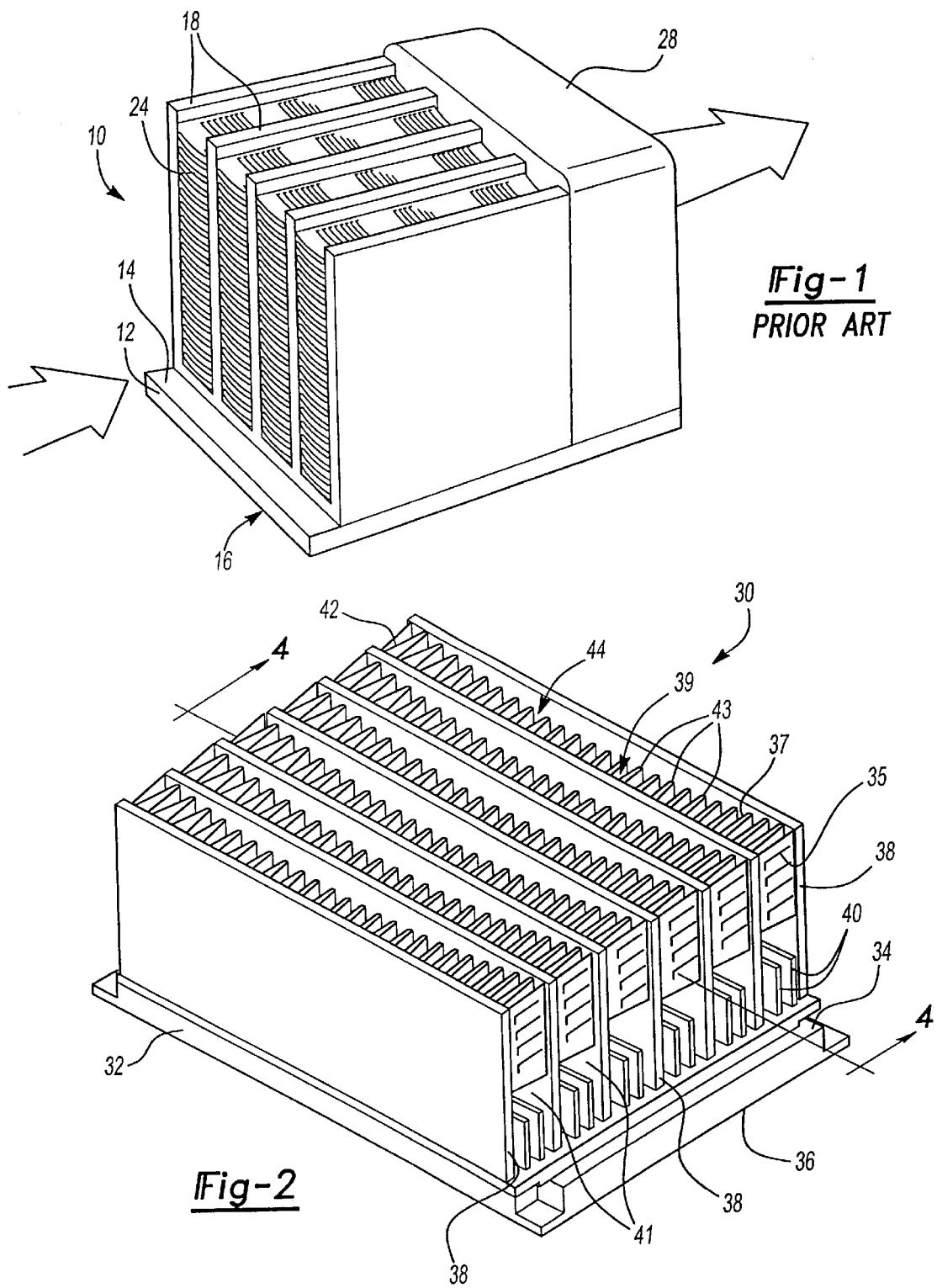

HEAT SINK WITH MULTIPLE SURFACE ENHANCEMENTS

TECHNICAL FIELD

The present invention is directed to heat sinks in general, and more particularly to heat sinks for use in dissipating waste heat generated by electrical or electronic components and assemblies.

BACKGROUND OF THE INVENTION

High power electrical and electronic components continue to have an increasing demand for higher power dissipation within a relatively confined space. Ever increasing electronic device speeds and power utilization have thus required continually increased heat dissipation capabilities of the associated heat sinks. In order to provide for such higher power dissipation requirements while remaining suitably compact, several levels of thermal management are usually required at the device, sub-assembly and component level.

At the component level, various types of heat exchangers and heat sinks have been used that apply natural or forced convection or other cooling methods. Some of the cooling solutions utilized for electronics applications include air (natural or forced convection), liquid, and refrigerant cycle apparatuses. One type of prior art heat sink for electrical or electronic components implementing a forced air convection configuration is illustrated in FIG. 1 and shown generally at 10. Heat sink 10 employs a base plate 12 that has a bottom surface 16 to which the electrical device is attached and a top surface 14 from which a plurality of plates 18 extend upwardly defining wherein each adjacent pair of plates defines a space therebetween. The spaces between adjacent plates 18 are populated with convoluted folded fins 24 extending between adjacent plates 18 to define a plurality of substantially horizontal cooling passageways. A fan 28 is mounted at one end to draw or blow air through the cooling passageways to effect heat transfer from the fins 24 to the air drawn therethrough and then expelled from the heat sink 10.

For a given cooling application, the heat sink base footprint is typically fixed by a standard mounting pattern. The surfaces extending from the base and the fans must also fit within the available volume constraints of the same application. Since the base configuration is more or less standardized, performance improvements must then be derived primarily from enhancements to the extended surfaces. Heat transfer limitations in prior art heat sinks have been, in part, caused by:

1. Insufficient extended surface area for forced convection;
2. Insufficient enhancements to the extended surfaces;
3. Non-optimized thermal conduction paths to the extended surfaces; and
4. Poor volume or management of airflow through the extended surfaces.

Thus, what is desired is a heat sink incorporating enhancements to the surfaces extending from the base plate to further improve the efficiency of a heat sink over a given area of the base plate.

SUMMARY OF THE INVENTION

One aspect of the present invention is a heat sink for cooling electrical or electronic devices. The heat sink comprises a base plate having a top surface and a bottom surface for attaching to the electronic device. At least two vertical plates are affixed to and extend substantially perpendicularly from the top surface in a spaced apart manner and are parallel one to the other. A secondary fin is affixed to and extends between an upper portion of the vertical plates. The secondary fin has a top convoluted edge and a bottom convoluted edge and is oriented such that the bottom convoluted edge faces the top surface of the base plate. The secondary fin includes a plurality of individual fins formed in a convoluted accordion-like manner. The plurality of individual fins define a plurality of secondary fin passageways between adjacent ones of the individual fins wherein each secondary fin passageway extends from the top convoluted edge to the bottom convoluted edge.

Another aspect of the present invention is a method of cooling an electronic device. The method includes the steps of providing a heat sink of the type comprising a base plate having a top surface and a bottom surface, wherein a plurality of vertical plates are affixed to and extending substantially perpendicularly from the base plate top surface in a parallel spaced apart manner. The heat sink also includes a secondary fin affixed to and extending between an upper portion of each adjacent pair of vertical plates wherein the lower portion of each adjacent pair of vertical plates and the bottom of the secondary fin define a primary passageway at each end of the heat sink above the base plate. The secondary fin has a top edge and a bottom edge and oriented such that the bottom edge faces the base plate top surface. The secondary fin further includes a plurality of individual fins formed in a convoluted accordion-like manner defining a plurality of secondary fin passageways between adjacent ones of the individual fins. The bottom surface of the heat sink is affixed to electronic device, and a fan is attached to a top of the heat sink. The fan is then caused to draw air into the primary passageways and through the plurality of secondary fin passageways.

These and other advantages of the invention will be further understood and appreciated by those skilled in the art by reference to the following written specification, claims and appended drawings.

BRIEF DESCRIPTION OF THE DRAWINGS

FIG. 1 is a perspective view of a prior art forced convection heat sink.

FIG. 2 is a perspective view of a heat sink embodying the present invention, having the fan removed for clarity, wherein the heat sink includes enhancements to surfaces extending from the base.

DETAILED DESCRIPTION OF THE PREFERRED EMBODIMENT

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 4:
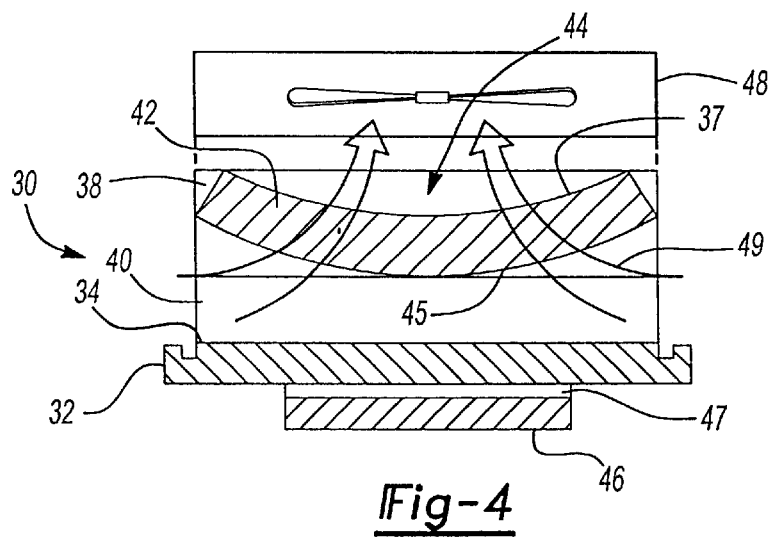
FIG. 4 is a cross-sectional view of the heat sink shown in FIG. 2 and taken along the line 4—4 of FIG. 2.

Turning to the drawings, FIGS. 2 and 4 show a heat sink 30 which is one of the preferred embodiments of the present invention and illustrates its various components.

Heat sink 30, most easily seen in FIGS. 2 and 4, includes a base plate 32 having a bottom surface 36 to which an electrical or electronic device 46 is attached utilizing a heat conducting adhesive 47 also commonly known as "thermal grease". Base plate 32 also has a top surface 34 from which extend a plurality of vertical plates 38. Vertical plates 38 are arranged parallel one to the other and are regularly spaced across top 34 defining a plurality of primary passageways 41 therebetween.

Within each space 41 between adjacent ones of plates 38, one or more primary fins 40 extend upwardly from top surface 34 in a manner like that of vertical plates 38. However, primary fins 40 are generally thinner and have a height substantially less than vertical plates 38. Primary fins can be affixed to top 34 of base 32 by adhesive or metallurgical bonding. Alternatively, primary fins 40 can be integrally formed with base plate 32.

A secondary fin 42 comprising a plurality of individual fins 43 formed in a convoluted accordion-like manner is affixed between a top portion of each pair of adjacent vertical plates 38. Secondary fins 42 can be affixed to vertical plates 38 by either adhesive or metallurgical bonding to more efficiently facilitate the conduction of heat from vertical plates 38 to individual fins 43 of secondary fin 42. As a result of secondary fin 42 being formed in an accordion like manner, it is relatively flexible and can be manipulated into different shapes. In the present embodiment, secondary fin 42 is arranged in an arcuate manner such that the top edge 37 thereof is concave with respect to the top edges of vertical plates 38 and the bottom edge 45 thereof is convex with respect to the top surface 34 of base 32. The arcuate top edges 37 of secondary fins 42 and the top edges of vertical plates 38 thereby define a plenum 44 between secondary fin 42 and fan 48. Plenum 44 facilitates a flow distribution of airflow 49 around a dead zone normally associated with the fan hub at the center of fan 48. By defining plenum 44 within the overall profile of heat sink 30, fan 48 can be mounted directly to the top of heat sink 30 without requiring a shroud or additional ducting.

As can be seen in FIG. 4, primary fin 40 has a top edge substantially parallel to top surface 34 of base 32. Adjacent individual fins 43 as a result of the accordion like folding of secondary fin 42 define a plurality of secondary fin passageways 39 between adjacent ones of individual fins 43. Secondary fin 42 is arcuately arranged such that at least a part of its bottom edge 45 is proximate to or touching the top edge of primary fins 40 thereby orienting the secondary fin passageways 39 in a radial-like manner with respect to the curved edges of secondary fin 42.

A fan 48 is placed on top of heat sink 30 such that when operated fan 48 draws air into the bottom of the fan and exhausts it from the top of the fan. In such manner, air is drawn into primary passageways 41 between the lower portions of vertical plates 38 and primary fins 40 and then up through secondary fin passageways 39 into plenum 44 as indicated by arrows 49. Once entering plenum 44 airflow 49 is easily redistributed therein to flow around the hub of fan 48. The airflow is then exhausted through the top of fan 48. Individual fins 43 can be formed to include discontinuities 35 such as having a plurality of bumps or a plurality of louvers. Discontinuities 35 function to disrupt the airflow 49 thereacross causing airflow 49 to become turbulent proximate to individual fins 43 and thus affecting a greater heat transfer between fins 43 and the airflow 49 passing thereacross. Since the airflow 49 enters primary passageways 41 in a generally horizontal flow and is thus redirected into a vertical flow as it is drawn up through fan 48, the arcuate orientation of secondary fin 42 aligning secondary fin passageways 39 in a radial-like fashion promotes a more efficient and less restricted airflow through heat sink 30.

Figure 3:
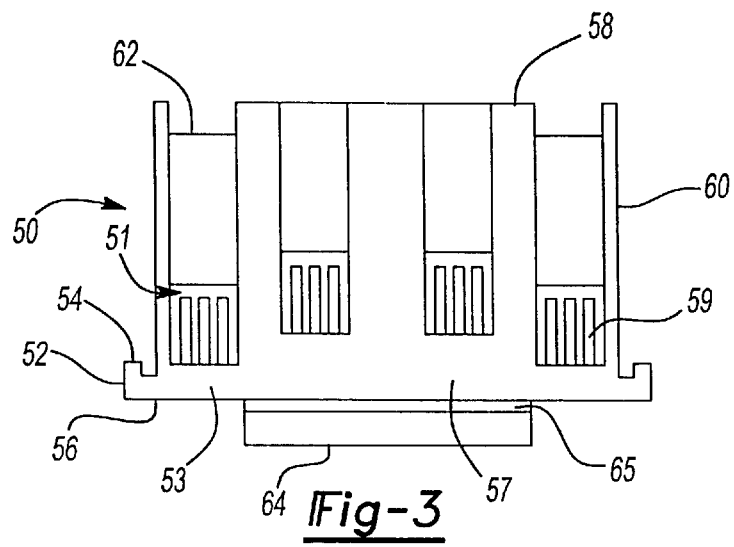
FIG. 3 is an selevation view of an alternate base plate-vertical plate configuration wherein the base plate has a non-uniform thickness.

Referring now to FIG. 3 alternate embodiment heat sink 50 is shown that is similar to heat sink 30 as discussed above wherein heat sink 50 includes a base plate 52 having a bottom surface 56 and a top surface 54. The electronic or electrical device 64 to be cooled is bonded to bottom surface 56 with a thermal adhesive 65. Top surface 54 has a plurality of vertical plates 58, 60 extending upwardly therefrom defining spaces 51 between adjacent ones of vertical plates 58 and 60. A plurality of primary fins 59 being substantially thinner and shorter than vertical plates 58 and 60 also extend upwardly from top surface 54 in each of the spaces 51. A convoluted secondary fin 62 extends between and is affixed to the upper portions of adjacent vertical plates 58 and 60. Secondary fins 62 are affixed by either adhesive or metallurgical bonding.

Base plate 52 of heat sink 50 has a region 57 that is substantially in registration with electronic device 64 and is thicker than an outer region 53 that extends outwardly beyond the outer edges of electronic device 64. Similarly, vertical plates 58 in the region directly above electronic device 64 have a thickness that is greater than the vertical plates 60 extending upwardly from region 53. In this manner, the thicker base plate region 57 and the thicker vertical plate 58 conduct more heat from the area above electronic device 64 which has a hotter thermal profile than the outer regions 53. Since the outer regions 53 and vertical plates 60 are exposed to a lower thermal density, their thicknesses are not required to be as great as central region 57 of base plate 52 and vertical plates 58.

Figure 5:
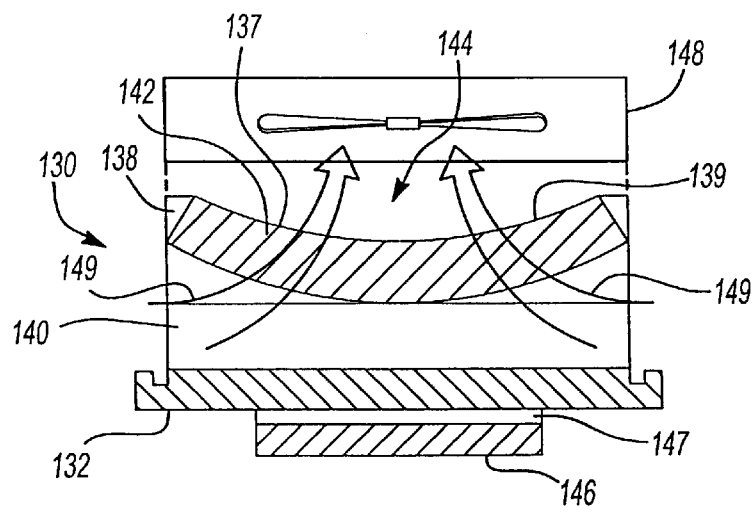
FIG. 5 is an alternate embodiment heat sink illustrating a cross-section of the same view as FIG. 4 wherein the vertical plates include a concave top surface corresponding to the upper curve of the convoluted secondary fins.

Referring now to FIG. 5, an alternate embodiment heat sink 130 is shown thereby with various alterations from heat sink 30 as shown in FIGS. 2 and 4. Elements of alternate embodiment heat sink 130 that are like or similar to elements of heat sink 30 are identified with like reference numbers preceded by the numeral "1". Heat sink 130 has a base plate 132 to which is affixed an electronic device 146 utilizing a thermally conductive adhesive 147 affixed to the bottom thereof. Base plate 132 has a plurality of vertical plates 138 extending from the top and further having one or more shorter and thinner primary fins 140 extending upwardly between vertical plates 138.

A secondary fin 142 formed as a convoluted accordion like fin is also arcuately arranged similar to that of secondary fin 42 in heat sink 30. Heat sink 130 differs from heat sink 30 in that the upper edge 139 of vertical plates 138 is formed in a concave manner to correspond to the concave contour of the upper edge 137 of primary fin 142. Upper edges 137 of primary fins 142 in combination with concave upper edges 139 of plates 138 define a single plenum 144 extending substantially across the entire width of heat sink 130. Vertical plates 138 at the very edges of base plate 132 may not have the upper edges contoured in a concave manner so as to substantially enclose plenum 144. In this manner, all of the air exhausted by fan 148 mounted thereabove would be drawn through heat sink 30 as indicated by airflow 149. Plenum 144 permits a flow distribution of airflow 149 throughout the area above primary fins 142 to more efficiently be distributed around a dead zone normally associated with the fan hub at the center of fan 148. By defining plenum 144 within the overall profile of heat sink 130, fan 148 can also be mounted directly to the top of heat sink 130 without requiring a shroud or additional ducting, thus maintaining a minimum profile of the combined heat sink and fan.

Figure 6:
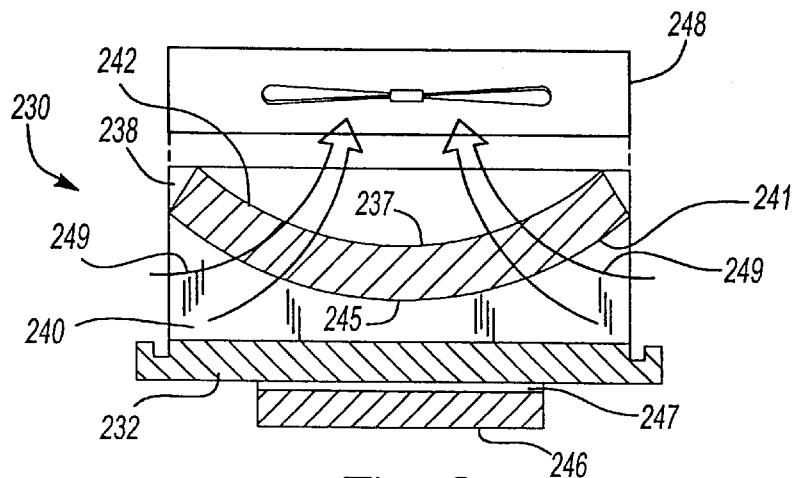
FIG. 6 is an alternate embodiment heat sink illustrating a cross-section of the same view as FIG. 4 wherein the primary fins include a concave top surface corresponding to and supporting the bottom curve of the convoluted secondary fins.

Referring now to FIG. 6, another alternate embodiment heat sink 230 is illustrated similar to heat sink 30 wherein like elements are identified with like numbers preceded by the numeral "2". An electronic device 246 is attached to a bottom surface of base plate 232 with a thermally conductive adhesive 247. Vertical plates 238 and primary fins 240 extend upwardly from the top surface of base plate 232 and a convoluted accordion like secondary fin 242 is arranged in an arcuate manner between upper portions of adjacent vertical plates 238. In this embodiment, primary fins 240 have a top edge 241 that is concavely arcuate to conform to the curvature of bottom edge 245 of arcuately arranged secondary fin 242. Thus, the bottom edge 245 of secondary fin 242 can rest upon the top edge 241 of primary fins 240. Secondary fin 242 can be affixed to vertical plates 238 and the top edge 241 of primary fins 240 by adhesive or metallurgical bonding. A fan 248 draws air through heat sink 230 according to airflow direction 249.

Figure 7:
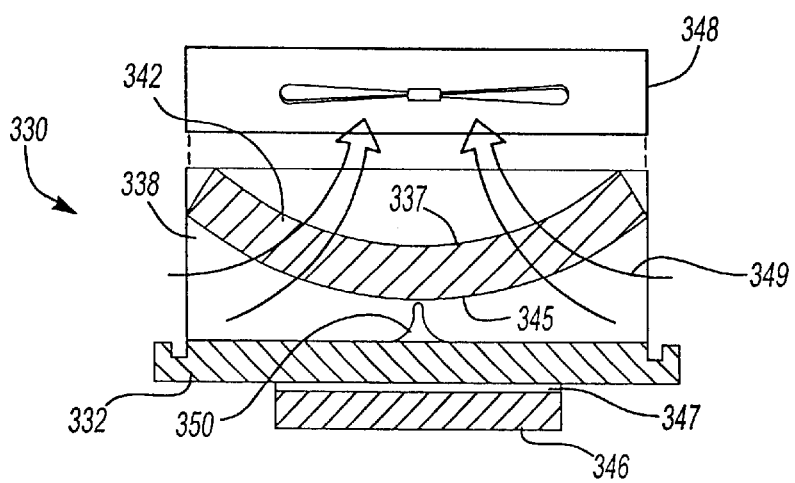
FIG. 7 is an alternate embodiment heat sink illustrating a cross-section of the same view as FIG. 4 wherein the primary fins are replaced with a flow director.

Yet another alternate embodiment heat sink 330 is shown in FIG. 7 that is similar to heat sink 30 such that like elements are identified with like numbers preceded by the numeral "3". Heat sink 330 has a base plate 332 to which an electronic device 346 is affixed with thermally conducted adhesive 347. Base plate 332 has a plurality of vertical plates 338 extending from a top surface and includes a convoluted accordion like folded secondary fin 342 between adjacent ones of vertical plates 338. Secondary fin 342 is arranged in an arcuate manner such that a top edge 337 thereof is concavely arcuate with respect to the top edges of vertical plates 338. Instead of additional primary fins extending upwardly from base plate 332 between adjacent vertical plates 338 a flow director 350 is positioned between adjacent vertical plates 338 substantially at a midpoint thereof. Flow director 350 has a pair of opposing concave surfaces which aid in redirecting the airflow drawn by fan 348 from the ends of heat sink 330 and out the top of heat sink 330 according to arrows 349.

Figure 8:
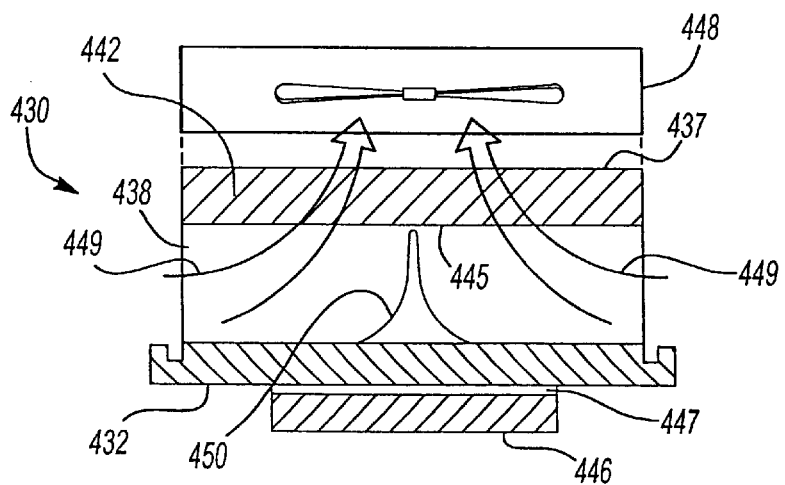
FIG. 8 is an alternate embodiment heat sink illustrating a cross-section of the same view as FIG. 4 wherein the primary fins are replaced with a flow director and the secondary fins are not arced.

Another alternate embodiment heat sink 430 is illustrated in FIG. 8. Heat sink 430 is similar to heat sink 330 as illustrated in FIG. 7 wherein like elements are like numbered except they are preceded by the numeral "4". Heat sink 430 differs from heat sink 330 in that flow director 450 is vertically taller and further in that folded convoluted secondary fin 442 is not arranged in an arcuate manner. Secondary fin 442 is arranged so that a top edge 437 thereof is substantially flush or parallel with a top edge of vertical plates 438. Fan 448 draws airflow 449 in through the heat sink ends whereupon flow director 450 redirects the air into a substantially vertical airflow to efficiently pass through secondary fins 442 and be exhausted through the top of fan 448.

In the foregoing description those skilled in the art will readily appreciate that modifications may be made to the invention without departing from the concepts disclosed herein. Such modifications are to be considered as included in the following claims, unless these claims expressly state otherwise.

I claim:

1. A heat sink for cooling electrical or electronic devices, said heat sink comprising:

a base plate having a top surface and having a bottom surface for attaching to the electronic device;

at least two vertical plates affixed to and extending substantially perpendicular from said top surface in a spaced apart manner, said at least two vertical plates parallel one to the other; and a secondary fin affixed to and extending between an upper portion of said at least two vertical plates, said secondary fin having a top convoluted edge and a bottom convoluted edge and oriented such that said bottom convoluted edge faces said top surface, said secondary fin further including a plurality of individual fins formed in a convoluted accordion-like manner and defining a plurality of secondary fin passageways between adjacent ones of said individual fins, each said secondary fin passageway extending from said top convoluted edge to said bottom convoluted edge, and wherein said secondary fin is arranged in an arcuate manner such that said top convoluted edge is concave with respect to a top edge of said vertical plates and a bottom edge is convex with respect to said top surface of said base plate.

2. A heat sink according to claim 1 further including a flow director affixed to said top surface and extending between said at least two vertical plate, said flow director having concavely shaped sides and generally extending to said bottom convoluted edge of said secondary fin for generally directing a flow of air from a horizontal flow to a vertical flow through said secondary fin.

3. A heat sink according to claim 2 wherein said secondary fin is arranged in an arcuate manner such that said top convoluted edge is concave with respect to a top edge of said vertical plates and a bottom edge is convex with respect to said top surface of said base plate.

4. A heat sink according to claim 1 further including at least one primary fin affixed to said top surface of said base plate and interposed between said at least two vertical plates, said at least one primary fin being substantially parallel to said at least two vertical plates and extending from said base plate to a height less than said at least two vertical plates.

5. A heat sink according to claim 4 wherein said height of said at least one primary fin generally extends to at least a portion of said bottom convoluted edge of said secondary fin.

6. A heat sink according to claim 5 wherein a top edge of said at least one primary fin is concavely contoured to receive therein said convex bottom convoluted edge of said secondary fin.

7. A heat sink according to claim 4 including a plurality of said vertical plates in said spaced apart manner and a plurality of secondary fins, each pair of adjacent ones of said vertical plates including one of said plurality of secondary fins affixed to and extending therebetween at an upper portion thereof, wherein interior ones of said vertical plates are thicker than outer ones of said vertical plates and an interior portion of said base plate is thicker than an outer portion of said base plate.

8. A heat sink according to claim 1 wherein a top edge of said at least two vertical plates is concavely formed in like manner as said top convoluted edge of said secondary fin.

9. A heat sink according to claim 1 including a plurality of said vertical plates in said spaced apart manner and a plurality of secondary fins, each pair of adjacent ones of said vertical plates including one of said plurality of secondary fins affixed to and extending therebetween at an upper portion thereof, said top edges of said pair of adjacent vertical plates defining a plenum between and in combination with said concave top convoluted edge of said secondary fin.

10. A heat sink according to claim 9 wherein end ones of said vertical plates include a generally horizontal top edge, and interior ones of said vertical plates include a top edge generally concavely formed in like manner as said top convoluted edges of said secondary fins thereby defining a single plenum between said end ones of said vertical plates and above said interior ones of said vertical plates and said secondary fins.

11. A method of cooling an electronic device, said method including the steps of:

providing a heat sink of the type comprising a base plate having a top surface and a bottom surface, wherein a plurality of vertical plates are affixed to and extending substantially perpendicularly from the base plate top surface in a parallel spaced apart manner, and including at least one primary fin affixed to the top surface of the base plate and interposed between each pair of adjacent vertical plates wherein the primary fin is substantially parallel to the vertical plates and extends from the base plate to a height less than the vertical plates and a secondary fin affixed to and extending between an upper portion of each adjacent pair of vertical plates, the lower portion of each adjacent pair of vertical plates and the bottom of the secondary fin defining a primary passageway at each end of the heat sink above the base place, the secondary fin having a top convoluted edge and a bottom convoluted edge and oriented such that the bottom convoluted edge faces the base plate top surface, and further including a plurality of individual fins formed in a convoluted accordion-like manner defining a plurality of secondary fin passageways between adjacent ones of the individual fins with the secondary fin arranged in an arcuate manner such that a top edge thereof is concave with respect to a top edge of the vertical plates and a bottom edge thereof is convex to the top surface of the base plate;

affixing the bottom surface of the heat sink to the electronic device;

attaching a fan to a top of the heat sink;

causing the fan to draw air into the primary passageways and through the plurality of secondary fin passageways.

12. The method according to claim 11 wherein the providing step includes an airflow director affixed to the top surface of the base plate below the secondary fin wherein the airflow director includes oppositely facing concave surfaces for directing the substantially horizontal airflow from the primary passageways into a vertical direction to flow through the secondary passageways.

13. The method according to claim 12 wherein the providing step includes arranging the secondary fin in an arcuate manner such that a top edge thereof is concave with respect to a top edge of the vertical plates and a bottom edge thereof is convex to the top surface of the base plate.

14. The method according to claim 11 wherein the providing step includes forming a top edge of the primary fins in a concave manner to receive therein the convex bottom edge of the secondary fin.

15. The method according to claim 14 wherein the providing step includes end ones of the vertical plates having a generally horizontal top edge, and interior ones of the vertical plates having a top edge generally concavely formed in like manner as the top edges of the secondary fins thereby defining a single plenum between the end ones of the vertical plates and above the interior ones of the vertical plates and secondary fins.

16. The method according to claim 11 wherein the providing step includes interior ones of the vertical plates being thicker than outer ones of the vertical plates and an interior portion of the base plate being thicker than an outer portion of the base plate.

* * * * *